United States Patent
Sakamoto

(10) Patent No.: US 6,212,126 B1
(45) Date of Patent: Apr. 3, 2001

(54) SEMICONDUCTOR DEVICE INCLUDING CLOCK GENERATION CIRCUIT CAPABLE OF GENERATING INTERNAL CLOCK STABLY

(75) Inventor: Wataru Sakamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/512,106

(22) Filed: Feb. 24, 2000

(30) Foreign Application Priority Data

Aug. 24, 1999 (JP) .................................... 11-236815

(51) Int. Cl.[7] .................................................. G11C 8/00
(52) U.S. Cl. ...................... 365/233; 365/194; 365/233.5
(58) Field of Search .............................. 365/233, 233.5, 365/194

(56) References Cited

U.S. PATENT DOCUMENTS

| | | | | |
|---|---|---|---|---|
| 5,740,123 | * | 4/1998 | Uchida | 365/233 |
| 5,883,534 | * | 3/1999 | Kondoh et al. | 327/156 |
| 5,940,344 | | 8/1999 | Murai et al. | 365/233 |
| 5,946,268 | | 8/1999 | Iwamoto et al. | 365/233 |
| 6,122,215 | * | 9/2000 | Ohsawa | 365/226 |

FOREIGN PATENT DOCUMENTS

| | | |
|---|---|---|
| 9-321614 | 12/1997 | (JP) . |
| 10-69769 | 3/1998 | (JP) . |
| 11-120769 | 4/1999 | (JP) . |

* cited by examiner

Primary Examiner—David Nelms
Assistant Examiner—Gene N. Auduong
(74) Attorney, Agent, or Firm—McDermott, Will & Emery

(57) ABSTRACT

In a DLL circuit used as an internal clock generation circuit in a semiconductor device, a reset clock signal is output from one element of the delay circuit and applied to a pulse generator to trigger reset of a pulse signal.

14 Claims, 12 Drawing Sheets

SEMICONDUCTOR DEVICE INCLUDING CLOCK GENERATION CIRCUIT CAPABLE OF GENERATING INTERNAL CLOCK STABLY

BACKGROUND OF THE INVENTION

1. Field of the Invention

The present invention relates to semiconductor devices, and particularly to a semiconductor device including a clock generation circuit that generates an internal clock in synchronization with a reference clock.

2. Description of the Background Art

Personal computers and work stations include a memory to store data. Among the memories, a DRAM (Dynamic Random Access Memory) that can read out and write data in large capacity is known to be used as the main memory for personal computers and work stations. Recently, a DDR SDRAM (Double Data Rate Synchronous Random Access Memory) is beginning to be used as the main memory for a work station.

This DDR SDRAM operates in synchronization with an externally applied clock signal. The DDR SDRAM includes a DLL (Delay Locked Loop) circuit to generate an internal clock signal in synchronization with an externally applied clock signal. The circuit in the DDR SDRAM operates in synchronization with this internal clock signal.

FIG. 16 shows a conventional DLL circuit disclosed in, for example, Japanese Patent Laying-Open No.11-120769. When an internal clock signal CLK1 in synchronization with a clock pulse ECLK is to be generated using this conventional DLL circuit, there is a possibility that the pulse will disappear during the passage through a delay line if the pulse width of clock pulse ECLK is small.

SUMMARY OF THE INVENTION

An object of present invention is to generate an internal clock signal stably in a semiconductor device by appropriately controlling the pulse width of the clock pulse input to the delay line of a DLL circuit.

According to an aspect of the present invention, a semiconductor device includes a clock generation circuit generating an internal clock. The clock generation circuit includes a first pulse generator receiving a reset clock signal and a first reference clock signal that repeats a first transition from a first level to a second level and a second transition from the second level to the first level, and generating a first pulse signal that is set in response to the first transition and reset in response to a predetermined level transition of the reset clock signal, and a delay circuit receiving an input clock signal according to the first pulse signal to output an internal clock signal. The delay circuit includes a plurality of delay stages connected in series to output a reset clock signal from a delay stage between the first and last delay stages.

According to another aspect of the present invention, a semiconductor device includes a clock generation circuit generating an internal clock. The clock generation circuit includes a phase comparator circuit comparing phases between a first reference clock signal that repeats a first transition from a first level to a second level and a second transition from the second level to the first level and an internal clock signal, a delay control circuit providing a delay control signal according to the comparison result generated from the phase comparator circuit, a first pulse generator generating a first pulse signal set in response to the first transition of the first reference clock signal and reset at an elapse of a delay time controlled by the delay control signal, and a variable delay circuit receiving an input clock signal driven in response to the first pulse signal to output an internal clock signal delayed in response to the delay control signal.

Therefore, the main advantage of the present invention is that an input clock signal of an appropriate pulse width can be obtained since the pulse signal generated from the pulse generator is reset by a reset clock signal from one of the delay stages in the delay circuit.

Also, an input clock signal of an appropriate pulse width can be obtained since the pulse width of the pulse signal generated from the pulse generator is controlled by the variable delay circuit responding to a delay control signal. Therefore, an internal clock signal of the semiconductor device can be generated stably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
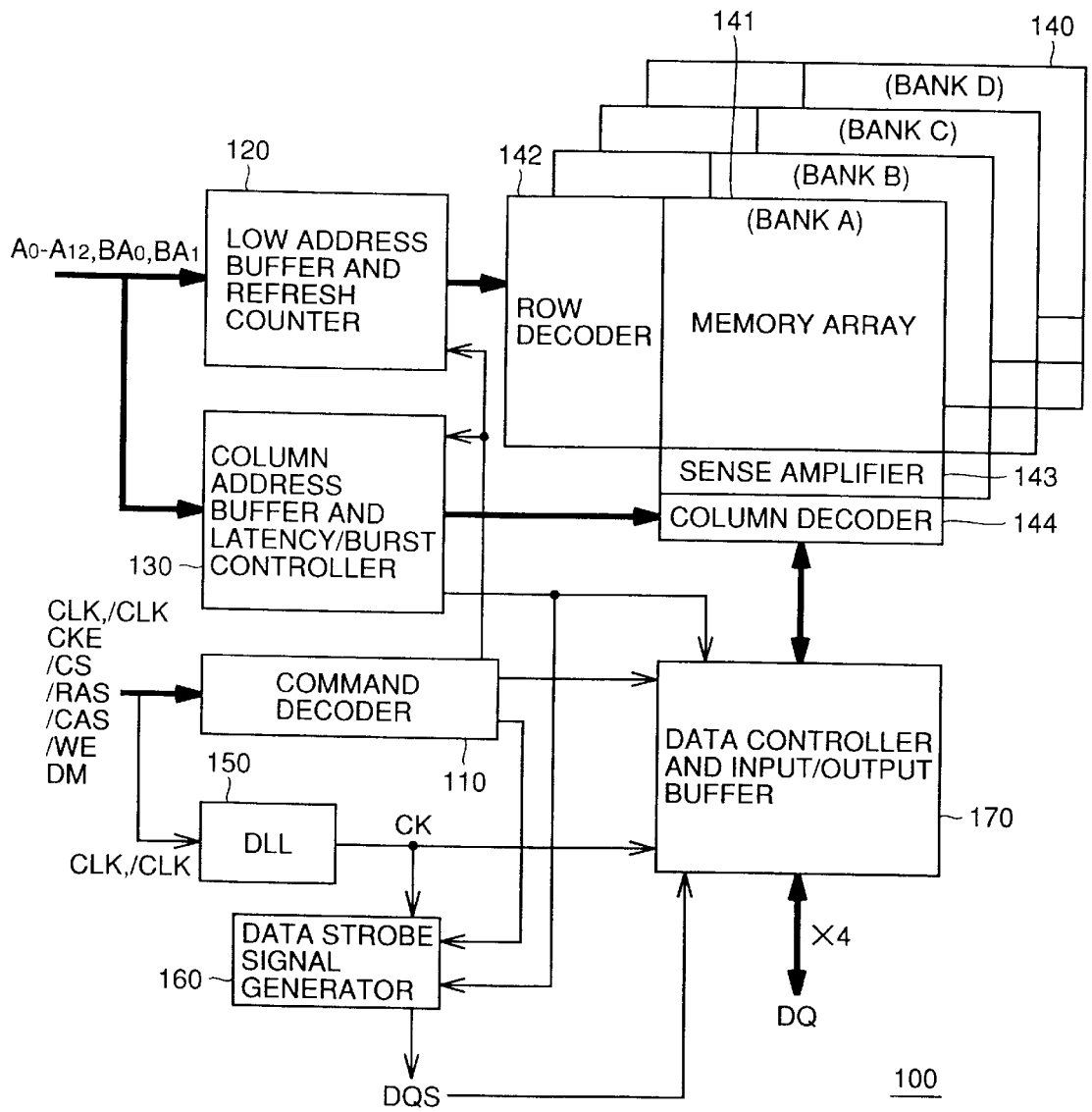
FIG. 1 is a block diagram showing a DDR SDRAM according to a first embodiment of present invention.

A DDR SDRAM (Double Data Rate Synchronous Random Access Memory) according to a first embodiment of the present invention will be described according to FIGS. 1–11. Referring to FIG. 1, a DDR SDRAM 100 receives a clock signal CLK and a clock signal /CLK that is complementary to clock signal CLK. Clock signal /CLK has a phase difference of 180 degrees ($\pi$ radian) with respect to clock signal CLK. Each of clock signals CLK and /CLK repeats the transition from an L level (logical low) to an H level (logical high) and a transition from an H level to an L level at a predetermined cycle, for example, at the cycle of 100 MHz when corresponding to the standard of PC 200 and at the cycle of 133 MHz when corresponding to the standard of PC 266.

DDR SDRAM 100 includes a command decoder 110. Command decoder 110 latches externally applied control signals (for example, clock enable signal CKE, chip select signal /CS, row address strobe signal /RAS, column address strobe signal /CAS, write enable signal /WE and data mask signal DM) in synchronization with externally applied clock signal CLK to decode these control signals. An operation command is specified according to a combination of the logics of these control signals. The command includes a bank active command, read command, write command, precharge command, CBR refresh command, self refresh command, and the like. Command decoder 110 decodes the applied command to output a plurality of types of internal control signals to control the operation of DDR SDRAM 100 in response to this command.

DDR SDRAM 100 includes a row address buffer and refresh counter 120. Row address buffer and refresh counter 120 receives externally applied address signals $A_0$–$A_{12}$ including a plurality of bits and bank address signals $BA_0$–$BA_1$ including a plurality of bits to output a row address signal and an internal bank address signal. Row address buffer and refresh counter 120 supplies externally applied address signals $A_0$–$A_{12}$ and bank address signals $BA_0$–$BA_1$ as the row address signal and internal bank address signal when the internal control signal from command decoder 110 indicates application of a bank active command to command decoder 110.

Row address buffer and refresh counter 120 generates and supplies a row address signal and internal bank address signal irrespective of externally applied address signals $A_0$–$A_{12}$ and bank address signals $BA_0$–$BA_1$ when the internal control signal from command decoder 110 indicates application of a refresh command (for example, CBR refresh command or self refresh command) to command decoder 110.

DDR SDRAM 100 further includes a column address buffer and latency/burst controller 130. Column address buffer and latency/burst controller 130 receives externally applied address signals $A_0$–$A_{12}$ and bank address signals $BA_0$–$BA_1$, to output a column address signal and an internal bank address signal. Column address buffer and latency/burst controller 130 supplies externally applied address signals $A_0$–$A_{12}$ and bank address signals $BA_0$–$BA_1$ as a column address signal and an internal bank address signal when the internal control signal from command decoder 110 indicates application of a read command or a write command to command decoder 110.

Column address buffer and latency/burst controller 130 sets the /CAS latency in response to a predetermined bit (for example, $A_4$–$A_6$) of externally applied address signals $A_0$–$A_{12}$ and sets the burst length in response to another predetermined bit (for example, $A_0$–$A_2$) when the internal control signal from command decoder 110 indicates application of a mode register set command to command decoder 110.

DDR SDRAM 100 further includes a plurality of banks 140, i.e. banks A, B, C and D. Each bank includes a memory array 141 in which a plurality of memory cells are arranged in a plurality of rows and columns, a row decoder 142 to select a row in memory array 141, a sense amplifier 143 to sense and amplify the memory cell data appearing in a column in memory array 141, and a column decoder 144 to select a column in memory array 141. Each bank 140 is configured to have a memory cell selected of an address independent of the address of a memory cell selected in another bank. In other words, an arbitrary memory cell in each bank can be selected regardless of which memory cell is selected in another bank.

Row decoder 142 decodes the row address signal and internal bank address signal from row address buffer and refresh counter 120. Accordingly, the memory cells of a row corresponding to the row address signal (therefore, according to address signals $A_0$–$A_{12}$) is selected in bank 140 corresponding to the internal bank address signal (therefore, according to bank address signals $BA_0$–$BA_1$).

Sense amplifier 143 senses and amplifies the data appearing at the column in memory array 141 and of the memory cells of the row selected by row decoder 142. Column decoder 144 decodes the column address signal and internal bank address signal from column address buffer and latency/burst controller 130. Then, the data out of the data amplified by sense amplifier 143, and of the column corresponding to the column address signal (therefore, according to address signals $A_0$–$A_{12}$) in bank 140 corresponding to the internal bank address signal (therefore, according to bank address signals $BA_0$–$BA_1$) is selected.

DDR SDRAM 100 further includes a DLL (Delay Locked Loop) circuit 150 as one type of a clock generation circuit. DLL circuit 150 receives externally applied clock signals CLK and /CLK as the reference clock signal to output an internal clock signal CK in synchronization with these clock signals. Internal clock signal CK is a multiplier clock signal that rises in synchronization with both the rising edge and falling edge of clock signal CLK. The rising edge of internal clock signal CK responds to the inversion of the levels of clock signals CLK and /CLK. Internal clock signal CK has a frequency two times that of clock signals CLK and /CLK.

DDR SDRAM 100 further includes a data strobe signal generator 160. Data strobe signal generator 160 receives an internal clock signal CK from DLL circuit 150 and an internal control signal from command decoder 110 to output a data strobe signal DQS. When the internal control signal from command decoder 110 indicates application of a read command to command decoder 110, data strobe signal DQS is driven to a low level at one cycle (at the cycle of clock signal CLK) before the value of the /CAS latency set by column address buffer and latency/burst controller 130, and exhibits level transition corresponding to the rising edge and falling edge of clock signal CLK at the elapse of a cycle corresponding to the value of the /CAS latency after application of a read command.

This data strobe signal DQS exhibits level transition in response to a rising edge of internal clock signal CK subsequent to the elapse of a cycle corresponding to the value of the /CAS latency following application of a read command. In other words, data strobe signal DQS exhibits level transition in response to the inversion of the levels of clock signals CLK and /CLK. The level transition of data strobe signal DQS has a duration corresponding to the value of the burst length set by column address buffer and latency/burst controller 130.

DDR SDRAM 100 further includes a data controller and input/output buffer 170. Data controller and input/output buffer 170 responds to the internal control signal from command decoder 110 and the /CAS latency and burst length set at column address buffer and latency/burst controller 130 to output data DQ from memory array 141 in synchronization with internal clock signal CK from DLL circuit 150. Data controller and input/output buffer 170 responds to the internal control signal from command decoder 110 and the burst length set at column address buffer and latency/burst controller 130 to provide externally applied data DQ to memory array 141 in synchronization with externally applied data strobe signal DQS.

When the internal control signal from command decoder 110 indicates application of a read command to command decoder 110, data controller and input/output buffer 170 begins to output read data DQ at the elapse of a cycle (the cycle of clock signal CLK) corresponding to the value of the /CAS latency after a read command is applied. Regarding the read data output, data corresponding to the burst length value are output in series to each of a plurality (for example 4) DQ pins in response to a rising edge of internal clock signal CK from DLL circuit 150. Data controller and input/output buffer 170 can output in series the data from memory array 141 selected by column decoder 144 to each DQ pin.

When the internal control signal from command decoder 110 indicates that a write command has been applied to command decoder 110, data controller and input/output buffer 170 sequentially receives the write data of the burst length externally applied to each DQ pin in series in response to level transition of data strobe signal DQS. The write data is applied to the column of the memory array selected by column decoder 144. It is possible to inhibit input of a portion of the write data that is supplied in series by a data mask signal DM. The above-described circuit is integrated on one semiconductor chip.

Figure 2:
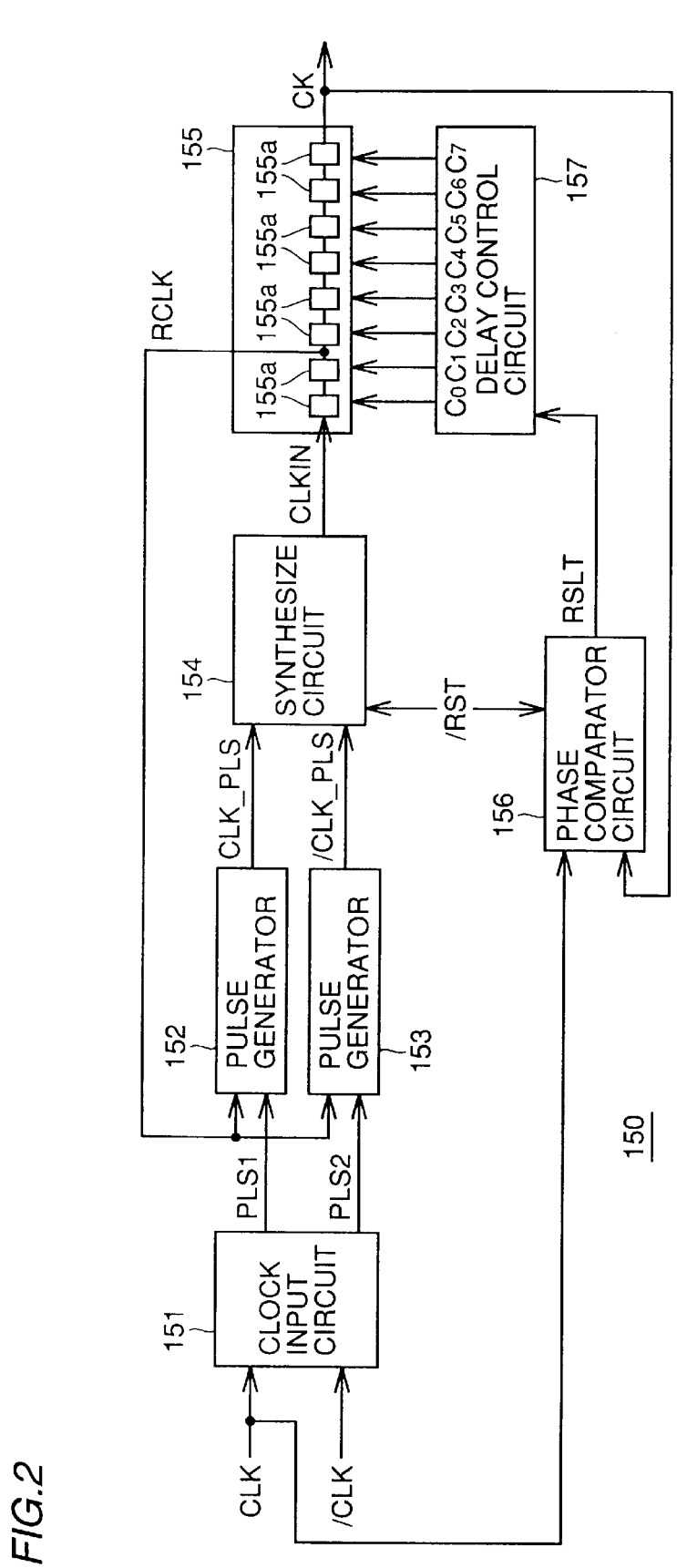
FIG. 2 is a block diagram showing a DLL circuit in the DDR SDRAM of the first embodiment.

FIG. 2 is a block diagram showing a DLL circuit 150 of FIG. 1. Referring to FIG. 2, DLL circuit 150 includes a clock input circuit 151 receiving clock signals CLK and /CLK to output pulse signals PLS1 and PLS2. Pulse signal PLS1 is a one shot pulse that attains a high level in response to the transition of clock signal CLK from a low level to a high level. More specifically, this signal is a one shot pulse that attains a high level in response to clock signal CLK exceeding the level of clock signal /CLK. Pulse signal PLS2 is a one shot pulse that attains a high level in response to the transition of clock signal /CLK from a low level to a high level. More specifically, this signal is a one shot pulse that attains a high level in response to clock signal /CLK exceeding the level of clock signal CLK.

DLL circuit 150 further includes a pulse generator 152 generating a pulse signal CLK_PLS that is set to a high level in response to pulse signal PLS1 attaining a high level and reset to a low level in response to reset clock signal RCLK exhibiting a predetermined level transition (for example, transition from a low level to a high level). Pulse signal CLK_PLS is set in response to pulse signal PLS1 attaining a high level, i.e. set to a high level in response to the transition of clock signal CLK from a low level to a high level. More specifically, pulse signal CLK_PLS is set to a high level in response to clock signal CLK exceeding the level of clock signal /CLK.

DLL circuit 150 further includes a pulse generator 153 generating a pulse signal /CLK_PLS set to a high level in response to pulse signal PLS2 attaining a high level and reset to a low level in response to a predetermined level transition (for example, transition to a high level from a low level) of reset clock signal RCLK. Pulse signal /CLK_PLS is set in response to pulse signal PLS2 attaining a high level, i.e. set to a high level in response to the transition of clock signal /CLK from a low level to a high level. More specifically, pulse signal /CLK_PLS is set to a high level in response to clock signal /CLK exceeding the level of clock signal CLK.

Furthermore, DLL circuit 150 includes a synthesize circuit 154 receiving pulse signals CLK_PLS and /CLK_PLS to synthesize these signals to output an input clock signal CLKIN. This synthesize circuit 154 receives a reset signal /RST that attains a low level designating reset when clock enable signal CKE is rendered inactive (low level). Synthesize circuit 154 renders pulse signal /CLK_PLS inactive (disable) when reset signal /RST is at a low level. In response to reset signal /RST attaining a high level to cancel the reset state, synthesize circuit 154 supplies pulse signal CLK_PLS as input clock signal CLKIN, and then supplies pulse signals /CLK_PLS and CLK_PLS alternately as input clock signal CLKIN.

DLL circuit 150 further includes a variable delay circuit 155 receiving input clock signal CLKIN to output internal clock signal CK. Variable delay circuit 155 includes a plurality of delay stages 155a connected in series. Variable delay circuit 155 outputs a reset clock signal RCLK from one of delay stages between the first delay stage and the last delay stage. In this embodiment, the delay stage outputting a reset clock signal RCLK is located at the ¼ position between the first delay stage and last delay stage. Input clock signal CLKIN is driven in response to pulse signals CLK_PLS and /CLK_PLS.

DLL circuit 150 includes a phase comparator circuit 156 comparing the phases of internal clock signals CK and clock CLK. More specifically, phase comparator circuit 156 divides internal clock signal CK by a factor of 2 and compares the phase of the divided clock signal with that of clock signal CLK. Phase comparator circuit 156 generates a phase comparison result RSLT of these clock signals.

DLL circuit 150 further includes a delay control circuit 157 controlling the delay value of variable delay circuit 155 according to comparison result RSLT output from phase comparator circuit 156. Delay control circuit 157 outputs delay control signals $C_0$–$C_7$ according to phase comparison result RSLT. Each delay stage 155a commonly receives delay control signals $C_0$–$C_7$.

Figure 3:
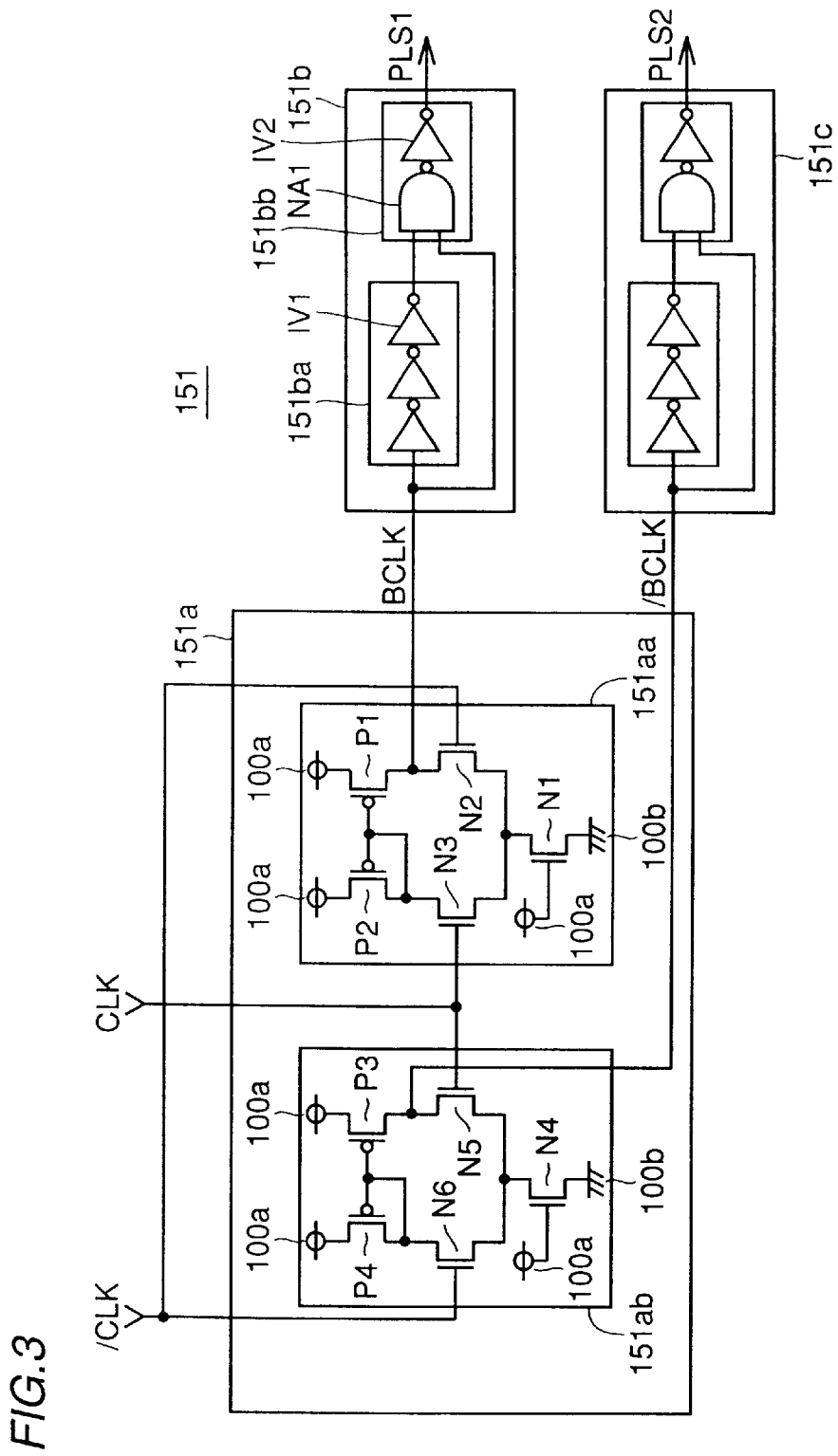
FIG. 3 is a circuit diagram showing a clock input circuit of the DLL circuit of the first embodiment.

Referring to FIG. 3, clock input circuit 151 includes a clock buffer 151a, a pulse generator 151b and a pulse generator 151c. Clock buffer 151a includes differential amplifiers 151aa and 151ab. Differential amplifier 151aa outputs a buffered clock signal BCLK that attains a high level and a low level when the level of clock signal CLK is higher than and lower than the level of clock signal /CLK, respectively. Differential amplifier 151ab outputs a buffered clock signal /BCLK that attains a high level and a low level when the level of clock signal /CLK becomes higher than and lower than the level of clock signal CLK, respectively.

Differential amplifier 151aa includes p channel MOS transistors P1 and P2 having their sources connected to a power supply node 100a. Transistors P1 and P2 have their gates both connected to the drain of transistor P2. Buffered clock signal BCLK is output from the drain of transistor P1. Differential amplifier 151aa also includes an n channel MOS transistor N1 having its source connected to a ground node 100b and its gate connected to power supply node 100a. Differential amplifier 151aa further includes an n channel MOS transistor N2 connected between the drain of p channel MOS transistor P1 and the drain of n channel MOS transistor N1, and receiving clock signal /CLK at its gate. Differential amplifier 151*aa* also includes an n channel MOS transistor N3 connected between the drain of p channel MOS transistor P2 and the drain of n channel MOS transistor N1, and receiving clock signal CLK at its gate.

Differential amplifier 151*ab* includes p channel MOS transistors P3 and P4 having their sources connected to power supply node 100*a*. Transistors P3 and P4 have their gates both connected to the drain of transistor P4. Buffered clock signal /BCLK is output from the drain of transistor P3. Differential amplifier 151*ab* also includes an n channel MOS transistor N4 having its source connected to ground node 100*b* and its gate connected to power supply node 100*a*. Differential amplifier 151*ab* further includes an n channel MOS transistor N5 connected between the drain of p channel MOS transistor P3 and the drain of n channel MOS transistor N4, and receiving clock signal CLK at its gate. Differential amplifier 151*ab* further includes an n channel MOS transistor N6 connected between the drain of p channel MOS transistor P4 and the drain of n channel MOS transistor N4, and receiving clock signal /CLK at its gate.

Pulse generator 151*b* includes a delay circuit 151*ba* receiving buffered clock signal BCLK and providing an inverted delay signal thereof. Delay circuit 151*ba* includes, for example, an odd number of inverters IV1 connected in series. Pulse generator 151*b* also includes an output unit 151*bb* receiving buffered clock signal BCLK and the output of delay circuit 151*ba*, setting pulse signal PLS1 at a high level during the delay time of delay circuit 151*ba* at the transition of buffered clock signal BCLK to a high level from a low level. Output unit 151*bb* includes a NAND circuit NA1 and an inverter IV2. Pulse generator 151*c* has a structure similar to that of pulse generator 151*b*, provided that signal /BCLK is received instead of clock signal BCLK and pulse signal PLS2 is output instead of pulse signal PLS1.

Figure 4:
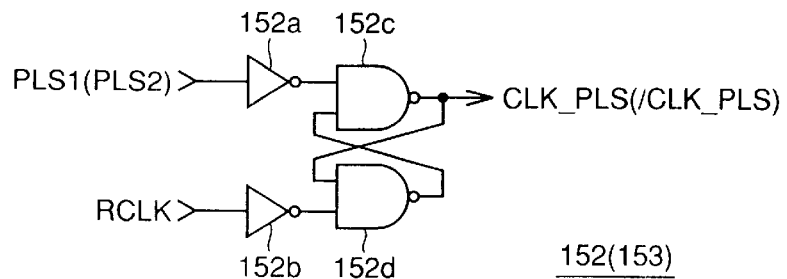
FIG. 4 is a circuit diagram showing a pulse generator of the DLL circuit of the first embodiment.

Referring to FIG. 4, pulse generator 152 includes inverters 152*a* and 152*b*. Pulse generation circuit 152 includes NAND circuits 152*c* and 152*d* forming a flip flop circuit. Pulse signal CLK_PLS output from NAND circuit 152*c* is set to a high level irrespective of the level of reset clock signal RCLK when pulse signal PLS1 attains a high level. Pulse signal CLK_PLS is reset to a low level when pulse signal PLS1 attains a low level and reset clock signal RCLK attains a high level. Pulse generator 153 has a structure similar to that of pulse generator 152, provided that pulse signal PLS2 is received instead of pulse signal PLS1 and pulse signal /CLK_PLS is output instead of pulse signal CLK_PLS.

Figure 5:
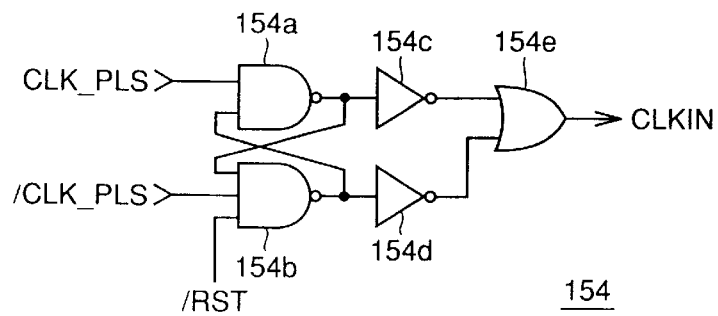
FIG. 5 is a circuit diagram showing a synthesize circuit of the DLL circuit of the first embodiment.

Referring to FIG. 5, synthesize circuit 154 includes NAND circuits 154*a* and 154*b* forming a flip flop. Synthesize circuit 154 further includes inverters 154*c* and 154*d*, and an OR circuit 154*e*. Reset signal /RST attains a high level so that the high level of pulse signal CLK_PLS is applied as input clock signal CLKIN prior to the high level of pulse signal /CLK_PLS.

Figure 6:
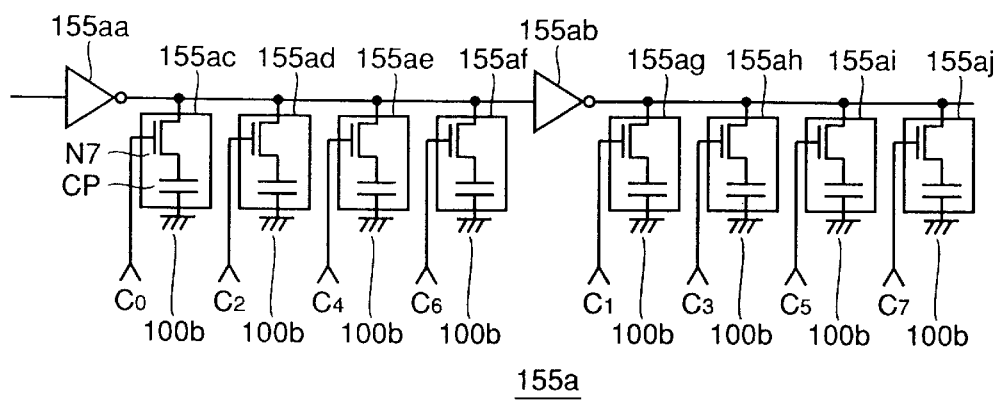
FIG. 6 is a circuit diagram showing a delay stage of the DLL circuit of the first embodiment.

FIG. 6 is a circuit diagram showing one of delay stage 155*a* of FIG. 2. Referring to FIG. 6, delay stage 155*a* includes inverters 155*aa* and 155*ab* connected in series between the input and the output. Delay stage 155*a* further includes variable capacitance circuits 155*ac*, 155*ad*, 155*ae* and 155*af* connected between an output node of inverter 155*aa* and ground node 100*b*. Variable capacitance circuits 155*ac*, 155*ad*, 155*ae* and 155*af* receive delay control signals $C_0$, $C_2$, $C_4$ and $C_6$ from respective delay control circuits to alter the capacitance related to the output node of inverter 155*aa*.

Delay stage 155*a* also includes variable capacitance circuits 155*ag*, 155*ah*, 155*ai* and 155*aj* connected between an output node of inverter 155*ab* and ground node 100*b*. Variable capacitance circuits 155*ag*, 155*ah*, 155*ai* and 155*aj* receive delay control signals $C_1$, $C_3$, $C_5$ and $C_7$ from respective delay control circuits to alter the capacitance related to the output node of inverter 155*ab*. Each of variable capacitance circuits 155*ac*–155*aj* includes a transistor N7 and a capacitor CP. When the delay value of delay stage 155*a* is increased, high level is attained in the order of $C_0$, $C_1$, $C_2$, $C_3$, $C_4$, $C_5$, $C_6$, $C_7$.

Figure 7:
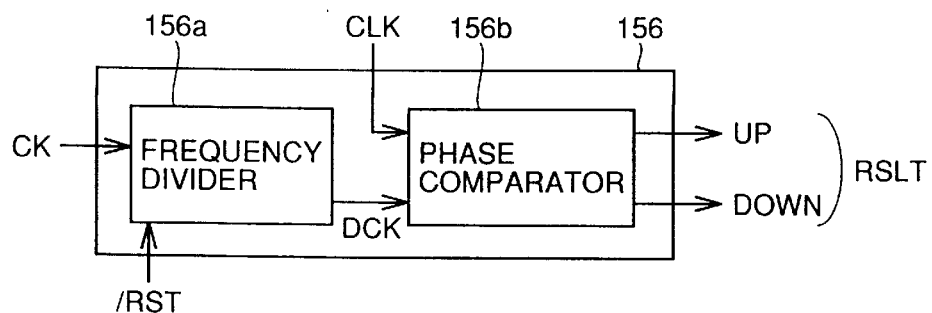
FIG. 7 is a circuit diagram showing a phase comparator circuit of the DLL circuit of the first embodiment.

Referring to FIG. 7, phase comparator circuit 156 includes a frequency divider 156*a* that divides clock signal CK by a factor of 2 to output a frequency-divided clock signal DCK. Frequency divider 156*a* is formed of a 2-bit counter that initiates counting in response to reset signal /RST attaining a high level. Counting is initiated from the rising edge of internal clock signal CK in response to the rise of pulse signal CLK_PLS, and counts the rising edge of internal clock signal CK in response to the next rise of pulse signal /CLK_PLS. Frequency-divided clock signal DCK exhibits level transition at every rises of internal clock signal CK.

Phase comparator circuit 156 compares the phases of clock signal DCK which is the output of frequency divider 156*a* and clock signal CLK by phase comparator 156*b*. When the phase of frequency-divided clock signal DCK is ahead of the phase of the clock signal CLK, a signal DOWN to designate phase delay is driven to a high level. When the phase of frequency-divided clock signal DCK is behind the phase of clock signal CLK, a signal UP to designate phase advance is driven to a high level. These signals UP and DOWN are generically represented by comparison result RSLT.

For example, in the case where signal UP attains a high level when delay control signals $C_0$–$C_3$ are at a high level and delay control signals $C_4$–$C_7$ are at a low level, delay control circuit 157 pulls down delay control signal $C_3$ to a low level accordingly. As a result, the delay value of delay stage 155*a* is reduced, whereby the phase of internal clock signal CK leads. In contrast, when signal DOWN attains a high level, delay control circuit 157 drives delay control signal $C_4$ to a high level accordingly. As a result, the delay value of delay stage 155*a* is increased, whereby the phase of internal clock signal CK lags.

Figure 8:
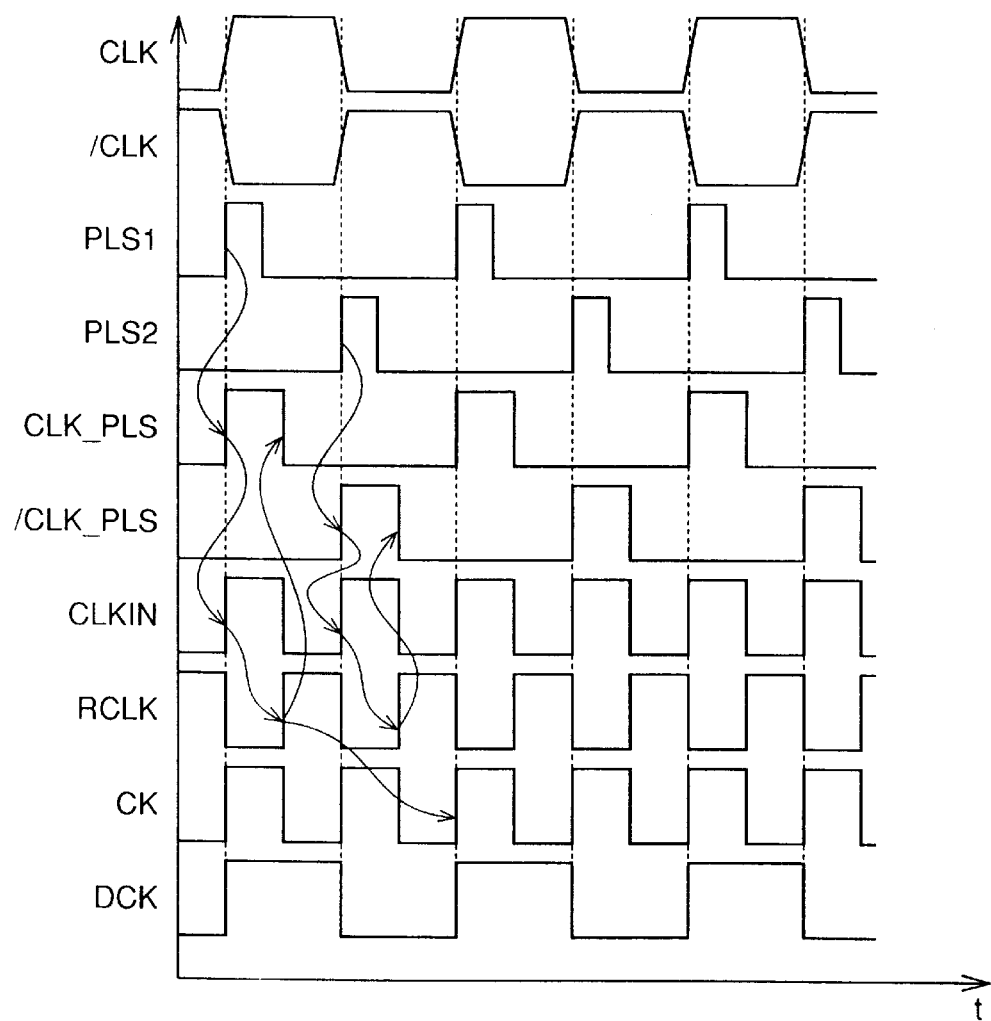
FIG. 8 is a timing chart representing the operation of the DLL circuit of the first embodiment.

FIG. 8 is a timing chart to describe the operation of DLL circuit 150. Referring to FIG. 8, pulse signal PLS1 is driven to a high level when clock signals CLK and /CLK attain a high level and a low level, respectively. Pulse signal CLK_PLS is set to a high level in response to pulse signal PLS1 attaining a high level. Pulse signals CLK_PLS and /CLK_PLS are synthesized to become input clock signal CLKIN. Input clock signal CLKIN passes through variable delay circuit 155 to be output as internal clock signal CK. Reset clock signal RCLK output from the ¼ point of variable delay circuit 155 attains a high level delayed by ¼ the delay time of variable delay circuit 155 in response to pulse signal CLK_PLS driven to a high level. Pulse signal CLK_PLS is reset to a low level in response to reset clock signal RCLK attaining a high level.

Then, pulse signal PLS2 attains a high level in response to clock signals CLK and /CLK attaining a low level and a high level, respectively. In response to pulse signal PLS2 attaining a high level, pulse signal /CLK_PLS is set to a high level. Reset clock signal RCLK output at the ¼ point of variable delay circuit 155 attains a high level delayed by ¼ the delay time of variable delay circuit 155 in response to pulse signal /CLK_PLS attaining a high level. Pulse signal /CLK_PLS is reset to a low level in response to reset clock signal RCLK attaining a high level. Internal clock signal CK is frequency-divided by phase comparator circuit 156 to become frequency-divided clock signal DCK. The phase of frequency-divided clock signal DCK is compared with the phase of clock signal CLK.

When the phase of frequency-divided clock signal DCK is ahead the phase of clock signal CLK as the comparison result, the delay value of variable delay circuit 155 is increased, and the operation of setting frequency-divided clock signal DCK in phase with clock signal CLK is executed. Conversely, when the phase is behind, the delay value of variable delay circuit 155 is reduced, and an operation of setting frequency-divided clock signal DCK in phase with clock signal CLK is carried out.

Upon the match of the phases of frequency-divided clock signal DCK and clock signal CLK, pulse signals CLK_PLS and /CLK_PLS are driven to a high level and then reset to a low level at ¼ the cycle of clock signal CLK. Therefore, an input clock signal CLKIN that has a duty ratio approximating 50% can be obtained. As a result, an internal clock signal CK having a duty ratio close to 50% can be obtained.

Figure 9A:
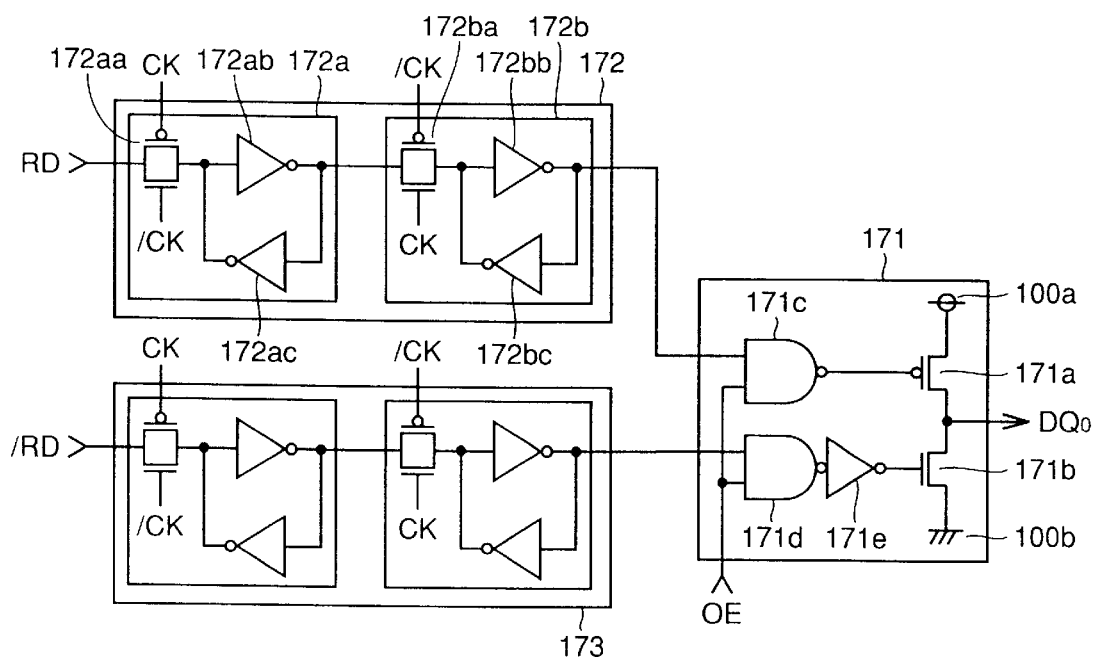
FIGS. 9A and 9B are circuit diagrams showing a data output buffer and a pipeline circuit of the DDR SDRAM of the first embodiment.
Figure 9B:
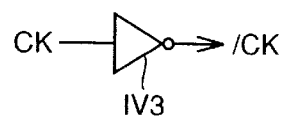

FIGS. 9A and 9B are circuit diagrams showing data controller and input/output buffer 170 of FIG. 1 partially. Referring to FIGS. 9A and 9B, data controller and input/output buffer 170 includes an inverter IV3 that outputs a signal /CK which is an inverted version of internal clock signal CK. Data controller and input/output buffer 170 also includes a data output buffer 171. Although the DDR SDRAM includes a plurality of data output buffers, the data output buffer corresponding to $DQ_0$ is typically shown in FIG. 9. Data controller and input/output buffer 170 also includes pipe line circuits 172 and 173 to apply read data RD and /RD from the memory array in series to data output buffer 171 in synchronization with internal clock signals CK and /CK.

Data output buffer 171 responds to the input of a read command to receive an output enable signal OE that attains a high level indicating enable for a period of time corresponding to the /CAS latency and burst length. Data output buffer 171 provides a high impedance output $DQ_0$ when output enable signal OE is at a low level. Data output buffer 171 responds to output enable signal OE of a high level to drive output $DQ_0$ to a high level when the output from pipe line circuit 172 is at a high level and the output from pipe line circuit 173 is at a low level, and to a low level when the output from pipe line circuit 172 is at a low level and the output from pipe line circuit 173 is at a high level.

Data output buffer 171 includes a p channel MOS transistor 171a connected between power supply node 100a and a data output pin $DQ_0$ (here, the pin and output at the pin are both represented as $DQ_0$). Data output buffer 171 includes an n channel MOS transistor 171b connected between data output pin $DQ_0$ of data output buffer 171 and ground node 100b. Data output buffer 171 further includes NAND circuits 171c and 171d. Furthermore, data output buffer 171 includes an inverter 171e.

Pipe line circuit 172 includes latch circuits 172a and 172b connected in series. Latch circuit 172a inverts input read data RD and applies the in inverted data to the next latch circuit 172b in response to internal clock signals CK and /CK driven to a low level and a high level, respectively. Latch circuit 172a latches read data RD when internal clock signals CK and /CK are driven to a high level and a low level, respectively.

Latch circuit 172a includes a transfer gate 172aa formed of a p channel MOS transistor receiving internal clock signal CK at its gate and an n channel MOS transistor receiving internal clock signal /CK at its gate. Latch circuit 172a also includes inverters 172ab and 172ac having their inputs and outputs connected to each other.

Latch circuit 172b inverts the output of latch circuit 172a and provides the inverted output to output buffer 171 when internal clock signals /CK and CK are driven to a low level and a high level, respectively. Latch circuit 172b latches the output of latch circuit 172a when internal clock signals /CK and CK are driven to a high level and a low level, respectively. Latch circuit 172b includes a transfer gate 172ba formed of a p channel MOS transistor that receives internal clock signal /CK at its gate and an n channel MOS transistor that receives internal clock signal CK at its gate. Latch circuit 172b also includes inverters 172bb and 172bc having their inputs and outputs connected to each other.

Pipe line circuit 173 has a structure similar to that of pipe line circuit 172 and operates in a similar manner, provided that read data /RD is received instead of read data RD, and the output is connected to NAND circuit 171d instead of NAND circuit 171c.

Figure 10:
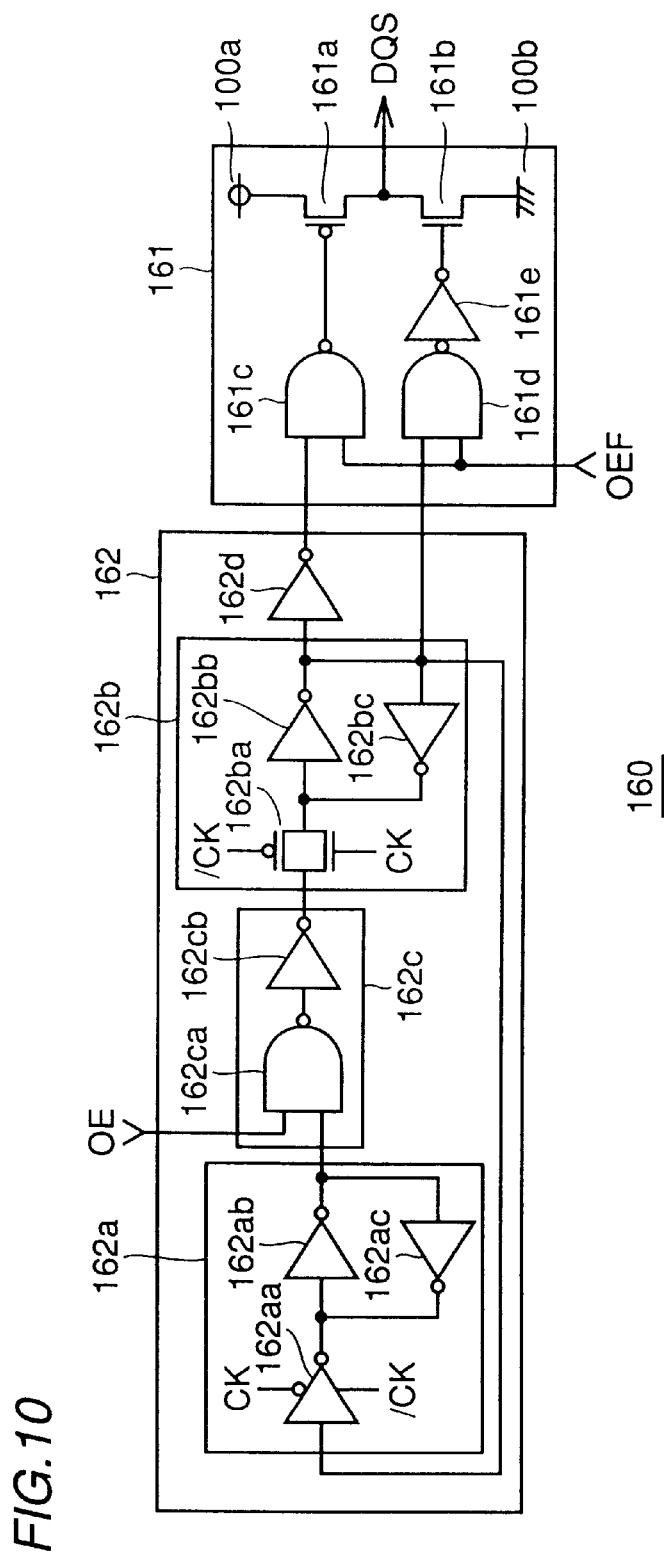
FIG. 10 is a circuit diagram showing a data strobe signal generator of the DDR SDRAM of the first embodiment.

Referring to FIG. 10, data strobe signal generator 160 includes a data strobe signal output buffer 161 having a structure similar to that of data output buffer 171. By providing similar structures therebetween, the delay values become the same. It therefore becomes easier to comply with the change in data strobe signal DQS at the start of the valid data output. Data strobe signal generator 160 further includes a counter 162. Data strobe signal output buffer 161 receives a fast output enable signal OEF that attains a high level indicating enable earlier by one cycle of clock signal CLK than output enable signal OE.

Data strobe signal output buffer 161 sets data strobe signal DQS at a high impedance state when output enable signal OEF is at a low level. Data strobe signal output buffer 161 drives data strobe signal DQS to a high level or a low level according to the output from counter 162 when output enable signal OEF is at a high level.

Data strobe signal output buffer 161 includes a p channel MOS transistor 161a connected between power supply node 100a and output pin DQS (the pin and the output at the pin are both represented as DQS). Data strobe signal output buffer 161 includes an n channel MOS transistor 161b connected between output pin DQS and ground node 100b. Data strobe signal output buffer 161 also includes NAND circuits 161c and 161d. Data strobe signal output buffer 161 includes an inverter 161e.

Counter 162 includes latch circuits 162a and 162b. Counter 162 also includes an initialize circuit 162c to apply an initial value of counter 162 in response to output enable signal OE. Counter 162 includes an inverter 162d. Latch circuit 162a includes a clocked inverter 162aa receiving internal clock signals CK and /CK and providing a signal which is an inverted version of the input when internal clock signals CK and /CK are at a low and a high level, respectively, and sets the output at a high impedance state when internal clock signals CK and /CK are at a high level and a low level, respectively. Latch circuit 162a further includes inverters 162ab and 162ac having their inputs and outputs connected to each other.

Latch circuit 162b includes a transfer gate 162ba formed of a p channel MOS transistor receiving internal clock signal /CK at its gate and an n channel MOS transistor receiving internal clock signal CK at its gate. Latch circuit 162b further includes inverters 162*bb* and 162*bc* having their inputs and outputs connected to each other. Initialize circuit 162*c* includes a NAND circuit 162*ca* and an inverter 162*cb*.

The output of inverter 162*bb* is at a high level and the output of inverter 162*d* is at a low level during the period of output enable signal OE at a low level. Therefore, when fast output enable signal OEF attains a high level one cycle earlier of clock signal CLK than output enable signal OE, data strobe signal DQS is driven from a high impedance state to a low level. Here, the output of inverter 162*ab* is maintained at a high level. In response to output enable signal OE attaining a high level, the output of inverter 162*cb* is driven to a high level. When internal clock signals CK and /CK attain a high level and a low level, respectively, transfer gate 162*ba* conducts. The output of inverter 162*bb* attains a low level and the output of inverter 162*d* attains a high level. Therefore, data strobe signal DQS is driven from a low level to a high level.

Then, in response to internal clock signals CK and /CK driven to a low level and a high level, respectively, clocked inverter 162*aa* inverts the output of inverter 162*bb*, and provides the inverted output to inverter 162*cb* via inverter 162*ab* and NAND circuit 162*ca*. The output of inverter 162*cb* is driven to a low level. Here, transfer gate 162*ba* is at a nonconductive state. The outputs of inverters 162*bb* and 162*d* are maintained at the low level and the high level, respectively. When internal clock signals CK and /CK attain a high level and a low level, respectively, again, the outputs of inverters 162*bb* and 162*d* are driven to a high level and a low level. Data strobe signal DQS is pulled down to a low level from a high level. Here, the output of inverter 162*ab* is maintained at the low level since the output clocked inverter 162*aa* is at a high impedance state. Thus, the level of data strobe signal DQS changes at every drive of internal clock signal CK to a high level.

The read operation of DDR SDRAM 100 will be described hereinafter with reference to the timing chart of FIG. 11 corresponding to the /CAS latency of 2 and the burst length of 4. Bank active command ACT is supplied by an externally applied control signal; bank address BA is applied by bank address signals $BA_0$–$BA_1$; and row address RA is supplied by address signals $A_0$–$A_{12}$. In response to clock signals CLK and /CLK driven to a high level and a low level, respectively, at time t1, bank active command ACT, bank address BA and row address RA are input to DDR SDRAM 100. In response to clock signals CLK and /CLK driven to a high level and a low level, respectively at time $t_2$, applied read command READ, bank address BA and column address CA are input into DDR SDRAM 100.

Data strobe signal DQS is driven from a high impedance state to a low level at time $t_3$ that is one cycle earlier than the value of the /CAS latency in response to input of a READ command at time t2. At time $t_4$ corresponding to the elapse of a cycle corresponding to the /CAS latency from time t2 when a READ command is input, data strobe signal DQS is pulled up to a high level and also data $D_0$ is output. Subsequently, the level of data strobe signal DQS is altered corresponding to the level change of clock signals CLK and /CLK at time $t_5$, $t_6$ and $t_7$, together with the output of data $D_1$, $D_2$ and $D_3$ in series. Data strobe signal DQS attains a high impedance state again at time $t_8$ corresponding to the completion of data output.

Second Embodiment

The DDR SDRAM of the second embodiment differs from the DDR SDRAM of the first embodiment in the structure of phase comparator circuit 156 of DLL circuit 150. The remaining structure is identical to that of first embodiment, and description thereof will not be repeated. Only the differing points will be described in detail.

Figure 11:
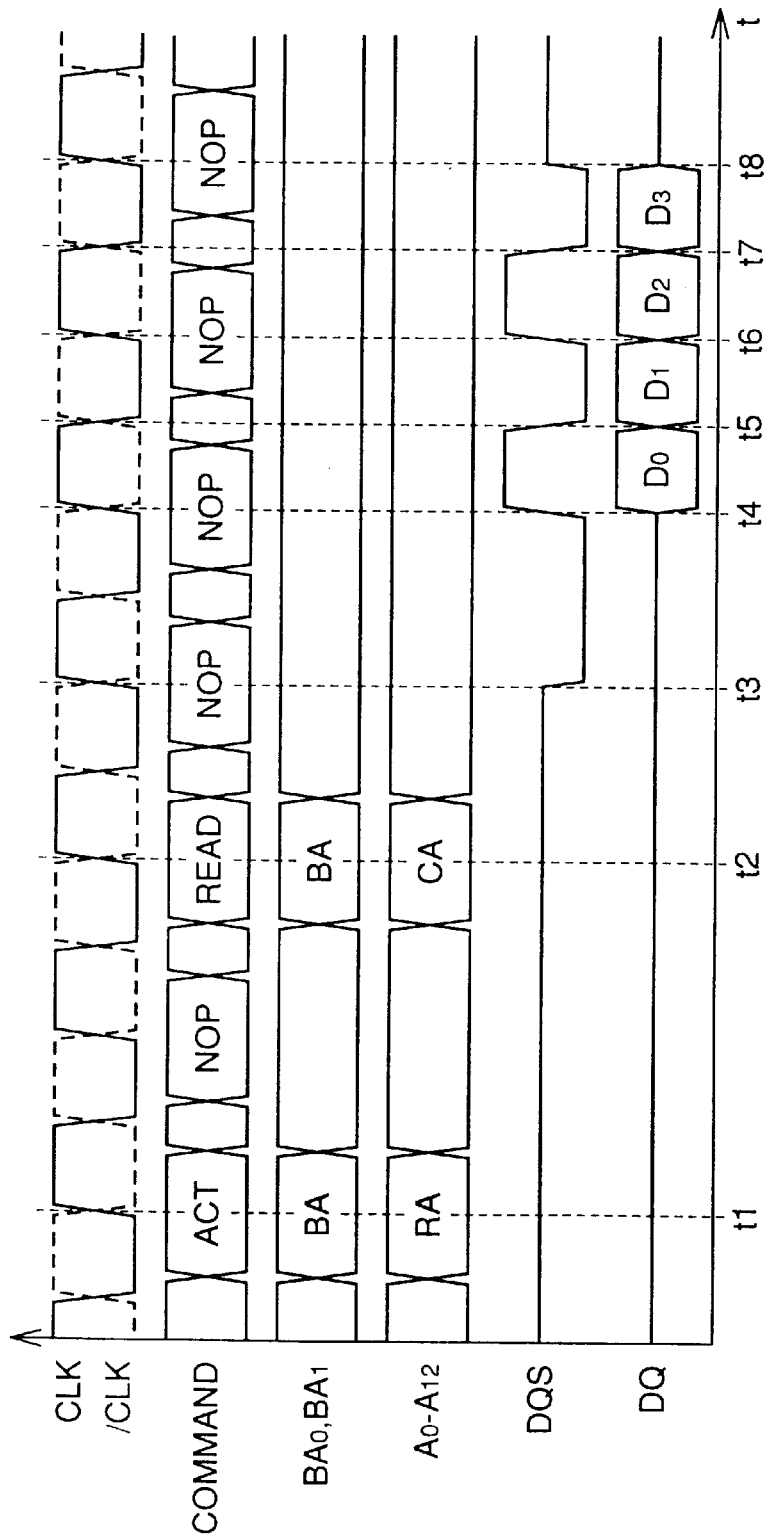
FIG. 11 is a timing chart representing a read operation of the DDR SDRAM of the first embodiment.

According to the structure of data controller and input output buffer 170 partially shown in FIG. 9, there is a possibility that data is not output in response to the change of clock signals CLK and /CLK as shown in FIG. 11 to result in a delayed output since the read data held in latch circuit 172*a* is output through inverters 172*bb* and data output buffer 171 after internal clock signals CK and /CK are driven to a high level and a low level, respectively.

Also, according to the structure of data strobe signal generation circuit 160 shown in FIG. 10, there is a possibility of data strobe signal DQS changing its level, not in response to the change in clock signals CLK and /CLK as shown in FIG. 11, but slightly delayed, since the output of inverter 162*cb* is provided passing through inverters 162*bb* and 162*d* and data strobe signal output buffer 161 following the drive of internal clock signals CK and /CK to a high level and a low level, respectively. The phases of internal clock signals CK and /CK should be slightly advanced in order to reduce this delay.

Figure 12:
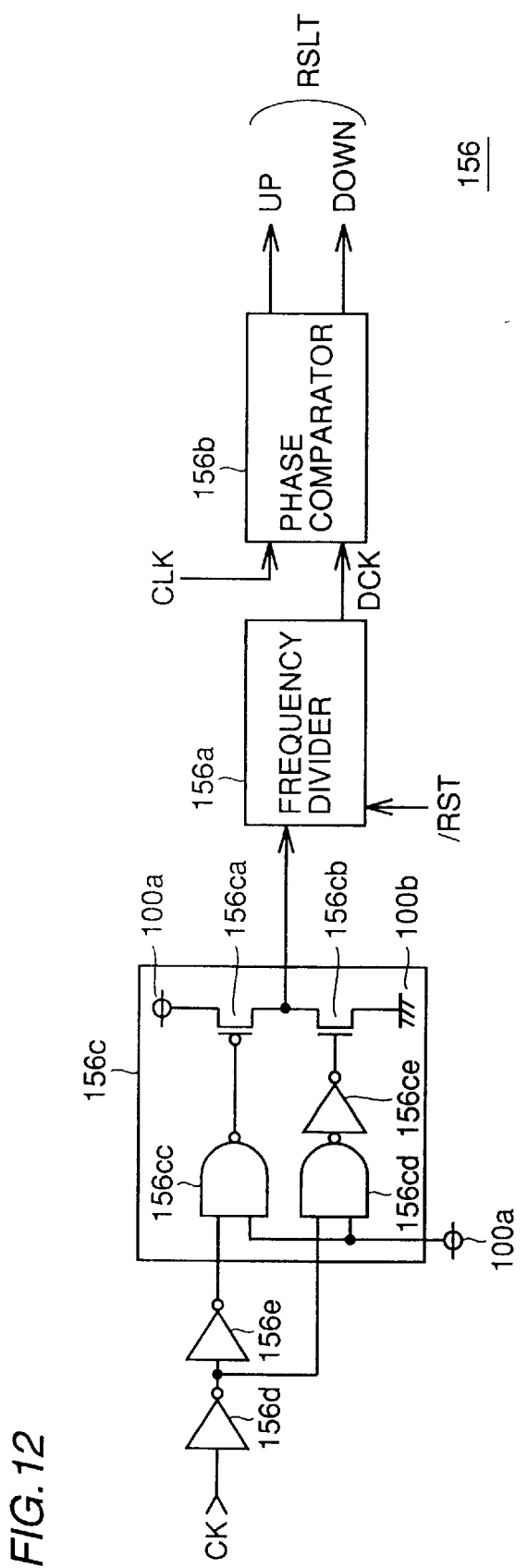
FIG. 12 is a circuit diagram showing a phase comparator circuit of a DLL circuit of a DDR SDRAM according to a second embodiment of the present invention.

FIG. 12 is a circuit diagram of phase comparator circuit 156. Referring to FIG. 12, phase comparator circuit 156 includes a delay replica circuit 156*c* and inverters 156*d* and 156*e* in addition to the structure of the phase comparator circuit shown in FIG. 7. Delay replica circuit 156*c* corresponds to data output buffer 171 shown in FIG. 9 and data strobe signal output buffer 161 shown in FIG. 10, and has a similar structure except for the input and output signals. Frequency divider 156*a* receives internal clock signal CK through this delay replica circuit 156*c*.

By forming phase comparator circuit 156 as described above, a signal which is a delayed version of input clock signal CK delayed by the delay of output buffers 171 and 161 can be made to synchronize with clock signal CLK. Therefore, the phases of internal clock signals CK and /CK are advanced more slightly than that of the first embodiment.

Thus, the data can be output reliably in accordance with the change in clock signals CLK and /CLK.

Third Embodiment

The third embodiment of the present invention provides a DLL circuit that can be implemented, not only in a DDR SDRAM, but also in a SDRAM of a single data rate.

Figure 13:
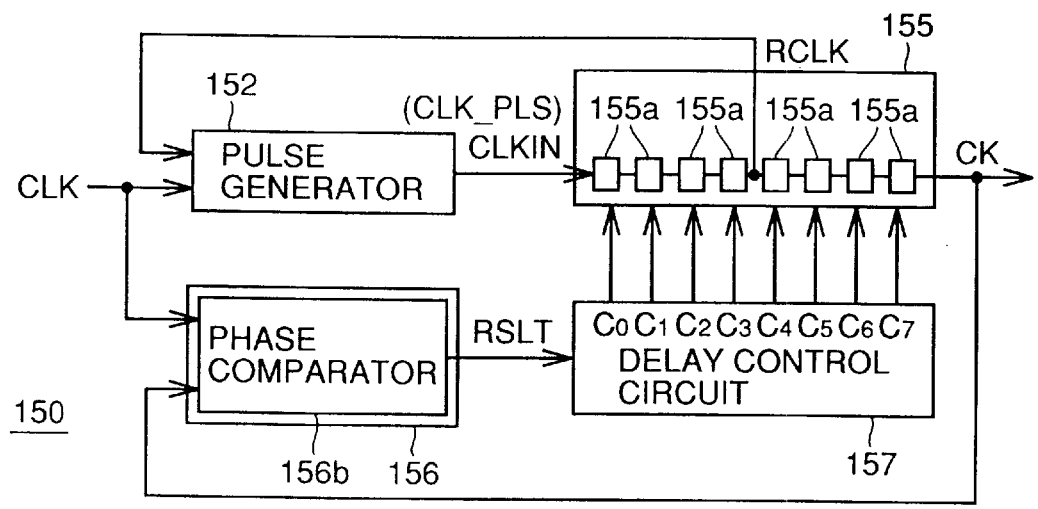
FIG. 13 is a circuit diagram showing a DLL circuit according to a third embodiment of the present invention.

FIG. 13 is a circuit diagram of a DLL circuit 150 employed in a single data rate SDRAM. Phase comparator 156*b* included in phase comparator circuit 156 is similar to the phase comparator shown in FIG. 7. Reset clock signal RCLK is output from delay stage 155*a* located at the ½ point of variable delay circuit 155. Pulse generator 152 outputs pulse signal CLK_PLS as input clock signal CLKIN. Therefore, input clock signal CLKIN is considered to be according to pulse signal CLK_PLS. Pulse generator 152, variable delay circuit 155 and delay control circuit 157 have a structure identical to that of the circuits in FIG. 2 allotted with the same reference characters.

Fourth Embodiment

A DDR SDRAM of the fourth embodiment differs from the DDR SDRAM of the first or second embodiment in the structure of DLL circuit 150. The remaining structure is similar to that of the first or second embodiment, and description thereof will not be repeated. Only the differing points will be described.

Figure 14:
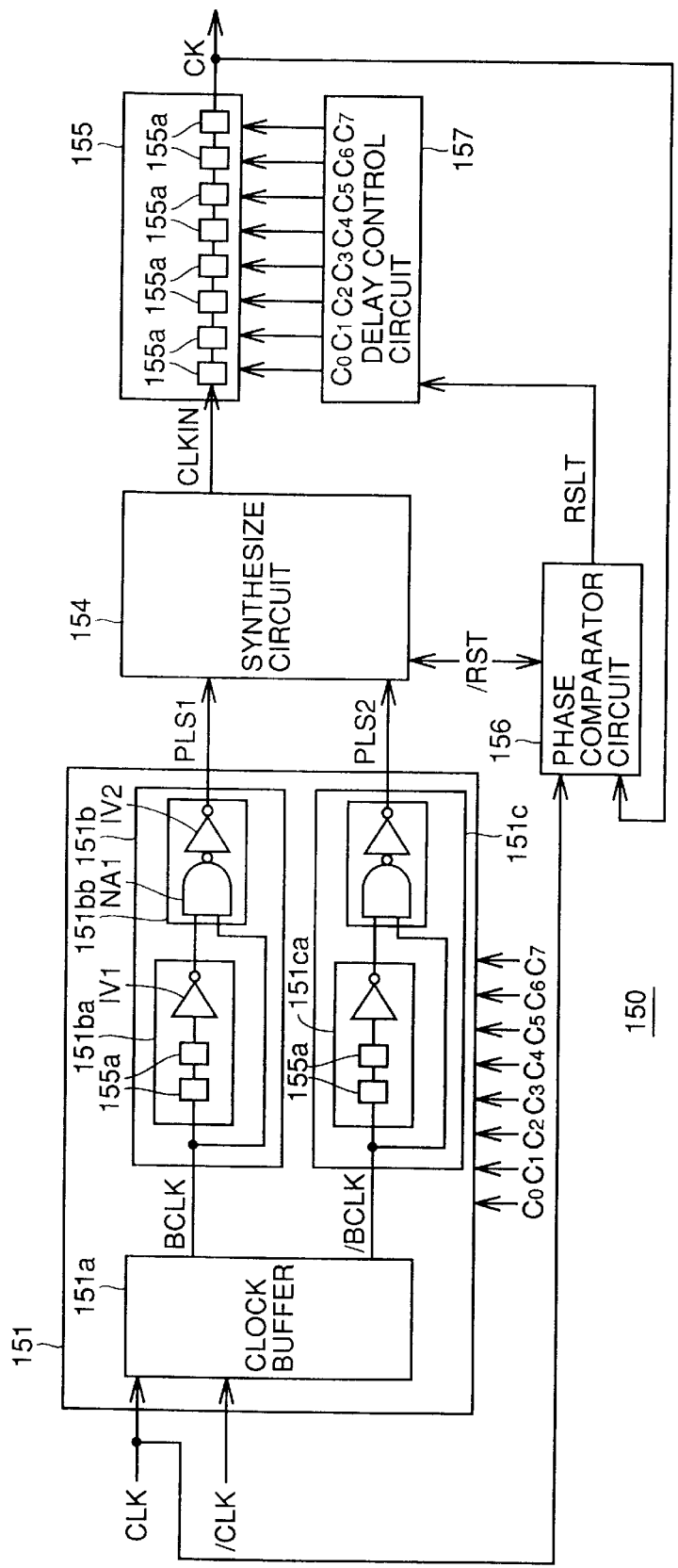
FIG. 14 is a circuit diagram showing a DLL circuit of a DDR SDRAM according to a fourth embodiment of the present invention.

FIG. 14 is a circuit diagram showing DLL circuit 150. DLL circuit 150 of the fourth embodiment does not include pulse generators 152 and 153 shown in FIG. 2. Synthesize circuit 154 receives pulse signals PLS1 and PLS2 from clock input circuit 151 instead of pulse signals CLK_PLS and /CLK_PLS. Clock input circuit 151 includes a clock buffer 151*a* having a structure similar to that of clock buffer 151*a* shown in FIG. 3.

Similar to the first and second embodiments, clock input circuit 151 includes pulse generators 151*b* and 151*c*. It is to be noted that the structure of delay circuits 151*ba* and 151*ca* in pulse generators 151*b* and 151*c* differs. Each of delay circuits 151*ba* and 151*ca* includes a plurality of delay stages 155*a* connected in series. The number of delay stages 155*a* corresponds to ¼ the number of delay stages 155*a* in variable delay circuit 155. The structure of one delay stage 155*a* included in delay circuits 151*ba* and 151*ca* is similar to that of one delay stage 155*a* in variable delay circuit 155 of FIG. 6.

Delay stage 155*a* included in delay circuits 151*ba* and 151*ca* receives delay control signals $C_0$–$C_7$ from delay control circuit 157 in common with delay stage 155*a* included in variable delay circuit 155. The delay time of delay circuits 151*ba* and 151*ca* is controlled by delay control signals $C_0$–$C_7$. Pulse generator 151*b* sets pulse signal PLS1 to a high level when buffered clock signal BCLK exhibits transition from a low level to a high level, and resets pulse signal PLS1 to a low level at the elapse of the delay time of delay circuit 151*ba*. Pulse generator 151*c* sets pulse signal PLS2 to a high level when buffered clock signal /BCLK exhibits transition from a low level to a high level, and resets pulse signal PLS2 to a low level at the elapse of the delay time of delay circuit 151*ca*. The remaining circuits in DLL circuit 150 have a structure similar to that of the circuits in the first and second embodiments allotted with the same reference characters.

Since delay circuits 151*ba* and 151*ca* are formed of a delay stage 155*a* similar in structure with delay stage 155*a* forming variable delay circuit 155, the process dependency and voltage dependency can be made the same between delay stage 155*a* in delay circuits 151*ba* and 151*ca* and delay stage 155*a* in variable delay circuit 155. Therefore, control is provided so that the delay value of delay stage 155*a* corresponds to a predetermined value by virtue of delay control signals $C_0$–$C_7$ even when there is variation in the process, temperature, or power supply voltage.

Since the high level period of pulse signals PLS1 and PLS2 can be made constant irrespective of variation in the process, temperature or power supply voltage, an input clock signal CLKIN having a duty ratio approximating 50% can be obtained even if there is variation in the process, temperature or power supply voltage. Thus, an internal clock signal CK having a duty ratio approximating 50% can be obtained.

Fifth Embodiment

Figure 15:
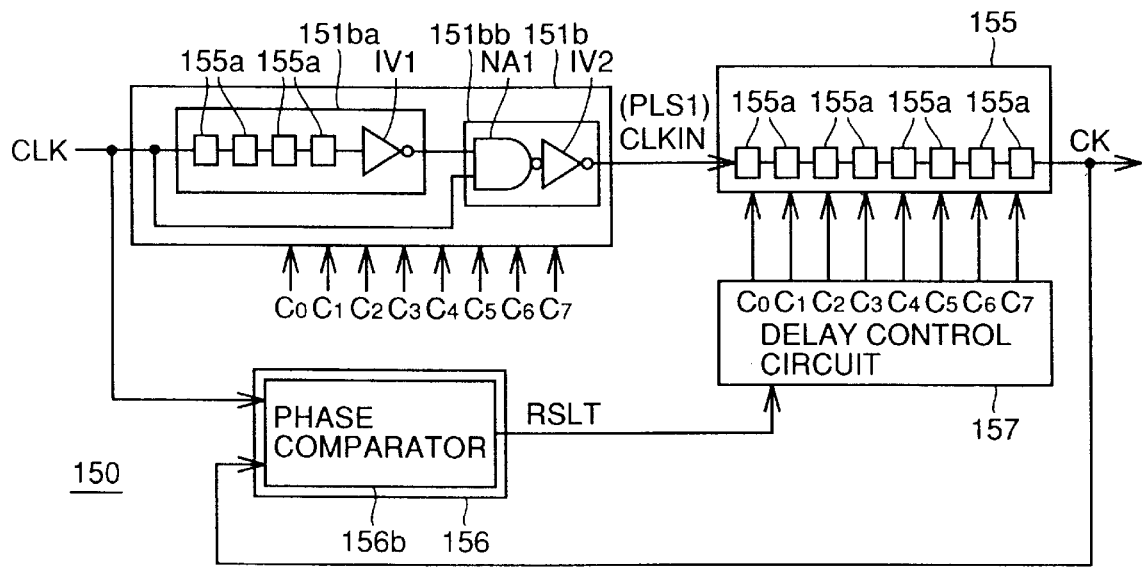
FIG. 15 is a circuit diagram showing a DLL circuit according to a fifth embodiment of present invention.
Figure 16:
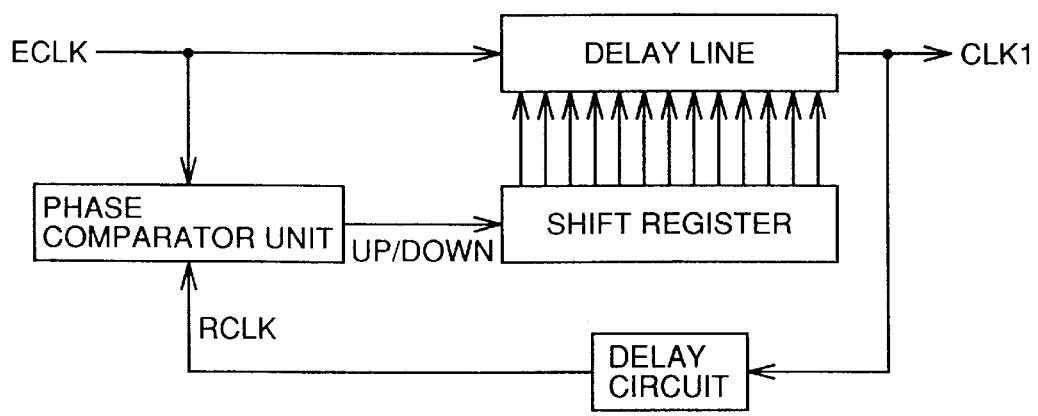
FIG. 16 is a block diagram showing a conventional DLL circuit.

FIG. 15 is a circuit diagram showing a DLL circuit 150 used in a SDRAM of the single data rate. Referring to FIG. 15, a phase comparator 156*b* included in phase comparator circuit 156 is similar to the phase comparator of FIG. 7. Pulse generator 151*b* provides pulse signal PLS1 as input clock signal CLKIN. Therefore, input clock signal CLKIN can be considered to be according to pulse signal PLS1. The number of delay stages 155*a* included in delay circuit 151*ba* is half the number of delay stages 155*a* included in variable delay circuit 155. The remaining circuits are similar to those shown in FIG. 14, and have the same reference characters allotted. Therefore, description thereof will not be repeated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a clock generation circuit generating an internal clock signal of said semiconductor device,
   said clock generation circuit including
   a first pulse generator generating a first pulse signal that is set in response to a first transition of a first reference clock signal that repeats the first transition from a first level to a second level and a second transition from the second level to the first level and reset in response to a predetermined level transition of a reset clock signal, and
   a delay circuit receiving an input clock signal according to said first pulse signal and providing said internal clock signal, said delay circuit including a plurality of delay stages connected in series to output said reset clock signal from a delay stage between the first delay stage and the last delay stage.

2. The semiconductor device according to claim 1, wherein said clock generation circuit further includes a second pulse generator generating a second pulse signal that is set in response to the first transition of a second reference clock signal complementary to said first reference clock signal, and that is reset in response to a predetermined level transition of said reset clock signal, and
   said input clock signal is a synthesized signal of said first and second pulse signals.

3. The semiconductor device according to claim 2, wherein said delay circuit outputs said reset clock signal from a delay stage located at the end of the first quarter of said plurality of delay stages.

4. The semiconductor device according to claim 1, wherein said clock generation circuit further includes a phase comparator circuit comparing phases of said internal clock signal and said first reference clock signal, and
   a delay control circuit controlling a delay value of said delay circuit according to a comparison result generated from said phase comparator circuit.

5. The semiconductor device according to claim 4, wherein said clock generation circuit further includes a second pulse generator generating a second pulse signal that is set in response to the first transition of a second reference clock signal complementary to said first reference clock signal, and that is reset in response to a predetermined level transition of said reset clock signal,
   said input clock signal is a synthesized signal of said first and second clock pulse signals, and
   said phase comparator circuit includes
   a frequency divider dividing said internal clock signal, and
   a phase comparator comparing phases of an output of said frequency divider and said first reference clock signal.

6. The semiconductor device according to claim 5, further comprising a data output buffer providing data in synchronization with said internal clock signal,
   wherein said phase comparator circuit further includes a delay replica circuit corresponding to said data output buffer, and
   said frequency divider receives said internal clock signal through said delay replica circuit.

7. The semiconductor device according to claim 1, further comprising a data strobe signal generator generating a data strobe signal in synchronization with said internal clock signal.

8. A semiconductor device comprising:

a clock generation circuit generating an internal clock signal of said semiconductor device, said clock generation circuit including a phase comparator circuit comparing phases of a first reference clock signal repeating a first transition from a first level to a second level and a second transition from the second level to the first level and said internal clock signal, a delay control circuit providing a delay control signal according to a comparison result generated from said phase comparator circuit, a first pulse generator generating a first pulse signal that is set in response to the first transition of said first reference clock signal, and that is reset at an elapse of a delay time controlled by said delay control signal, and a variable delay circuit receiving an input clock signal driven in response to said first pulse signal, and providing said internal clock signal delayed in response to said delay control signal.

9. The semiconductor device according to claim 8, wherein said clock generation circuit further includes a second pulse generator generating a second pulse signal that is set in response to the first transition of a second reference clock signal complementary to said first reference clock signal, and that is reset at an elapse of a delay time controlled by said delay control signal, and said input clock signal is a synthesized signal of said first and second pulse signals.

10. The semiconductor device according to claim 9, wherein said phase comparator circuit includes a frequency divider dividing said internal clock signal, and a phase comparator comparing phases of an output of said frequency divider and said first reference clock signal.

11. The semiconductor device according to claim 10, further comprising a data output buffer providing data in synchronization with said internal clock signal, wherein said phase comparator circuit further includes a delay replica circuit corresponding to said data output buffer, and said frequency divider receives said internal clock signal through said delay replica circuit.

12. The semiconductor device according to claim 8, further comprising a data strobe signal generator generating a data strobe signal in synchronization with said internal clock signal.

13. The semiconductor device according to claim 8, wherein said variable delay circuit includes a plurality of delay stages connected in series, said first pulse generator includes a delay circuit defining said delay time, including a plurality of delay stages of a structure identical to the structure of said plurality of delay stages in said variable delay circuit, and the plurality of delay stages in said variable delay circuit and the plurality of delay stages in the delay circuit of said first pulse generator commonly receive said delay control signal.

14. The semiconductor device according to claim 13, wherein each of the plurality of delay stages includes an inverter, and a capacitor connected to an output node of the inverter.

\* \* \* \* \*